(12) United States Patent
Shirasaki et al.

(10) Patent No.: US 8,426,084 B2
(45) Date of Patent: Apr. 23, 2013

(54) PELLICLE FOR LITHOGRAPHY

(75) Inventors: Toru Shirasaki, Annaka (JP); Kenichi Fukuda, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 105 days.

(21) Appl. No.: 12/954,351

(22) Filed: Nov. 24, 2010

(65) Prior Publication Data

US 2011/0129767 A1 Jun. 2, 2011

(30) Foreign Application Priority Data

Nov. 30, 2009 (JP) ................................. 2009-271747

(51) Int. Cl.
*G03F 1/64* (2012.01)
(52) U.S. Cl.
USPC ............................................................ 430/5
(58) Field of Classification Search ........ 430/5; 428/14; 524/858, 860, 861, 862
See application file for complete search history.

(56) References Cited

U.S. PATENT DOCUMENTS

| | | | |
|---|---|---|---|
| 4,657,805 A | 4/1987 | Fukumitsu et al. | |
| 4,861,402 A | 8/1989 | Gordon | |
| 4,878,973 A | 11/1989 | Ohtake et al. | |
| 5,693,382 A | 12/1997 | Hamada et al. | |
| 6,040,400 A | 3/2000 | Fukuda et al. | |
| 6,962,752 B2 * | 11/2005 | Fukuda et al. | 428/422 |
| 2008/0063952 A1 * | 3/2008 | Shirasaki | 430/5 |
| 2009/0018275 A1 * | 1/2009 | Campbell et al. | 525/416 |

FOREIGN PATENT DOCUMENTS

| | | | |
|---|---|---|---|
| JP | 58219023 A | 12/1983 | |
| JP | 60083032 A | 5/1985 | |
| JP | 07168345 A | 7/1995 | |
| JP | 09-206723 A | 8/1997 | |
| JP | 11116685 A | 4/1999 | |

OTHER PUBLICATIONS

Shirasaki et al., "A Pellicle for Lithography," Office Action mailed Jan. 10, 2012, for JP2009-271747, 5 pages.
Office Action mailed Mar. 1, 2012, for Chinese Application No. 2010105756835, 7 pages.

* cited by examiner

*Primary Examiner* — Stephen Rosasco
(74) *Attorney, Agent, or Firm* — Seed IP Law Group PLLC

(57) ABSTRACT

A pellicle 10 for lithography includes a pellicle frame 3, a pellicle membrane 1 adhered onto the upper end surface of the pellicle frame 3 and an agglutinant layer 4 formed on the lower surface of the pellicle frame 3 and the agglutinant layer 4 is formed by hardening a curable composition containing a straight chain perfluoro compound having a perfluoro structure in a main chain. The thus constituted pellicle 10 generates only a small amount of a decomposition gas even when it is used for a long time, thereby preventing solid-like foreign materials from separating out on a pattern region of a photomask 5 and can suppress degradation of an the agglutinant agent contained in an agglutinant layer 4 to be used for fixing a photomask 5 to the pellicle frame 3. Further, this pellicle 10 can be easily peeled off from a photomask 5 and replaced with a new one.

5 Claims, 1 Drawing Sheet

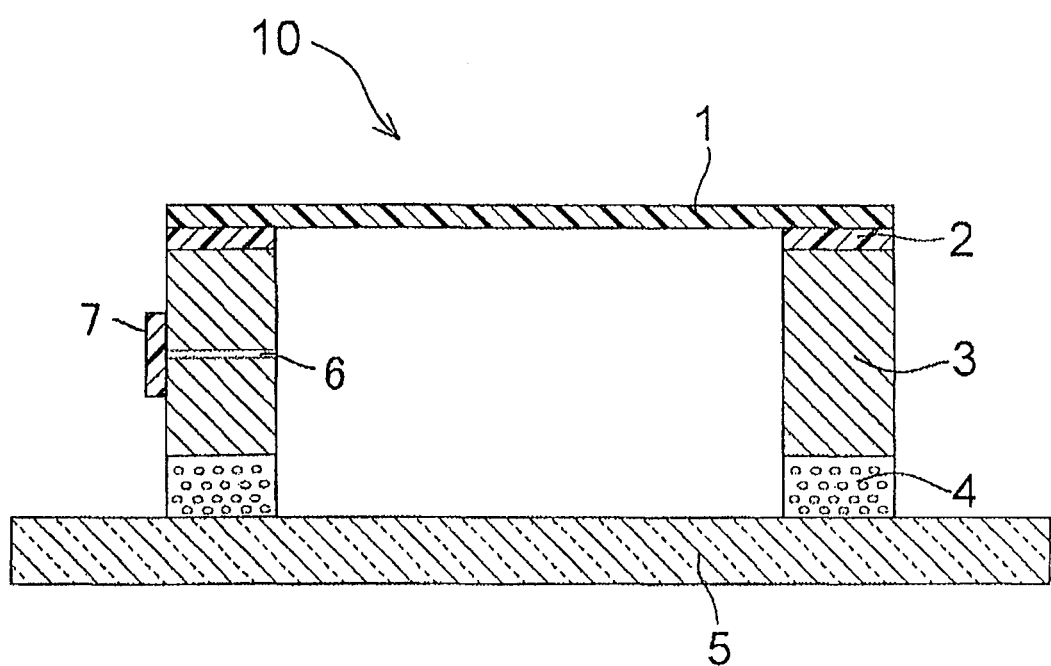

PELLICLE FOR LITHOGRAPHY

BACKGROUND

1. Technical Field

The present invention relates to a pellicle for lithography for use as a dustproof cover for a photomask, a reticle or the like in the manufacture of a semiconductor device such as a large-scale integrated circuit, a very-large-scale integrated circuit (LSI) or the like or a liquid crystal display panel.

2. Description of the Related Art

In the case of manufacturing a semiconductor device such as a large-scale integrated circuit (LSI), a very-large-scale integrated circuit or the like, or a liquid crystal display panel, a semiconductor wafer or a mother substrate for a liquid crystal display panel is irradiated with exposure light via an exposure stencil such as a photomask or a reticle (hereinafter collectively referred to as "photomask" in this specification), whereby a pattern of the photomask is transferred onto the semiconductor wafer or the mother substrate for a liquid crystal display panel so that a pattern of the semiconductor device or the liquid crystal display panel is formed.

Therefore, when the semiconductor wafer or the liquid crystal display panel mother substrate is irradiated with exposure light via the photomask, any foreign materials such as dust particles stuck to the photomask, reflect or absorb the exposure light, so that not only does the pattern transferred onto the semiconductor wafer or the liquid crystal display panel mother substrate become deformed and the edge portion of the pattern become blurred but underlying surface is also blackened by soiling, whereby the size, quality, appearance and the like of the semiconductor wafer or the liquid crystal display panel mother substrate are degraded. As a result, the pattern of the photomask cannot be transferred onto the semiconductor wafer or the liquid crystal display panel mother substrate in the desired manner and the performance of the semiconductor wafer or the liquid crystal display panel mother substrate is lowered, whereby the yield ratio of the semiconductor wafer or the liquid crystal display panel mother substrate is inevitably reduced.

In order to solve these problems, the operation of exposing the semiconductor wafer or the liquid crystal display panel mother substrate is generally conducted in a clean room. However, even in such a case, since it is extremely difficult to completely prevent foreign materials from attaching to the surface of the photomask, the operation of exposing the semiconductor wafer or the liquid crystal display panel mother substrate is usually conducted with a dust proof cover, called a pellicle, and having a high transmittance with respect to the exposure light, mounted on the surface of the photomask.

Generally, a pellicle is manufactured by adhering a pellicle membrane made of a material having a high transmittance with respect to exposure light, such as a cellulose based resin like nitrocellulose and cellulose acetate, fluoride system resin or the like, to one surface of a pellicle frame made of aluminum, stainless steel, polyethylene or the like by applying a good solvent for the material of the pellicle membrane onto the one surface of the pellicle frame and adhering the air-dried pellicle membrane onto the one surface of the pellicle frame, or adhering the pellicle membrane onto the one surface of the pellicle frame using an adhesive agent such as acrylic resin, epoxy resin, fluorine resin or the like, forming an agglutinant layer composed of polybutene resin, polyvinyl acetate resin, acrylic resin, silicone resin or the like and adapted for adhering the photomask to the pellicle frame on the other surface of the pellicle frame, and providing a liner for protecting the agglutinant layer on the agglutinant layer (See Japanese Patent Application Laid Open No. 58-219023, U.S. Pat. No. 4,861,402, Japanese Patent Publication No. 63-27707 and Japanese Patent Application Laid Open No. 7-168345, for example).

The pellicle is mounted on the photomask so as to surround a pattern region formed on the surface of the photomask, whereby the pattern region formed on the surface of the photomask and the region outside of the pellicle are isolated from each other by the pellicle so that dust particles present outside of the pellicle are prevented from adhering to the pattern region formed on the surface of the photomask.

In the case of mounting the thus constituted pellicle on the surface of the photomask and exposing the semiconductor wafer or the liquid crystal display panel mother substrate via the photomask, since foreign materials such as dust particles attach to the surface of the pellicle and do not directly attach to the surface of the photomask, it is possible to avoid the effect of foreign materials such as dust particles by projecting exposure light in such a manner that the light is focused on the pattern formed on the photomask.

Conventionally, an ultraviolet ray such as a G-line UV (436 nm wavelength) and an I-line UV (365 nm wavelength) has been used as the light for exposing an LSI. However, it has recently become necessary to use light having a shorter wavelength as the exposure light because LSI integration density has increased and circuit geometry become finer. Thus, a krypton fluoride (KrF) excimer laser beam (248 nm wavelength) is first used and an argon fluoride (ArF) excimer laser beam (193 nm wavelength) is then used.

However, in the case where the photomask on which a pellicle is mounted is exposed to an argon fluoride (ArF) excimer laser beam (193 nm wavelength) for a long time, solid-like foreign materials gradually separate out on the pattern region of the photomask surrounded by the pellicle.

It is considered that this problem of solid-like foreign materials gradually separating out on the pattern region of the photomask surrounded by the pellicle in the case where the photomask on which the pellicle is mounted is exposed for a long time is caused by the presence of ionic residue on the photomask, an ionic gas or an organic gas contained in the environment where the photomask is used, or reaction of an ionic gas or an organic gas emitted from the pellicle with an argon fluoride (ArF) excimer laser beam.

Among these problems, most of the organic gas emitted from the pellicle is emitted from an agglutinant agent contained in the agglutinant layer for fixing the pellicle to the photomask, so the agglutinant agent is often degassed by heating or keeping it under reduced pressure in advance.

The organic gas emitted from the agglutinant agent contained in the agglutinant layer depends on the kind of agglutinant agent and the higher the absorbing capacity of the agglutinant agent with respect to an argon fluoride (ArF) excimer laser beam (193 nm wavelength) is, the higher the risk of solid-like foreign materials separating out on the pattern region of the photomask is. Examples of an organic gas having a high absorbing capacity with respect to the argon fluoride (ArF) excimer laser beam (193 nm wavelength) include a hydrocarbon based gas such as an aromatic gas having a pi ($\pi$) electron. It is further known that an amine system gas, an alcohol system gas or an aldehyde system gas also has a high absorbing property with respect to the argon fluoride (ArF) excimer laser beam (193 nm wavelength).

On the other hand, it has been found that even if the emission of an organic gas from the agglutinant agent contained in the agglutinant layer is suppressed, in the case where the pellicle is used for a long time and exposed to the argon fluoride (ArF) excimer laser beam, the argon fluoride (ArF)

excimer laser beam scattered by the pellicle is projected onto the agglutinant layer, whereby the agglutinant agent contained in the agglutinant layer is decomposed to emit an organic gas and the organic gas reacts with the argon fluoride (ArF) excimer laser beam in a closed space defined by the pellicle and the photomask so that solid-like foreign materials separate out on the pattern region of the photomask surrounded by the pellicle.

It has further been observed that when the argon fluoride (ArF) excimer laser beam passes through the pellicle and the photomask, an ozone gas is generated in the closed space defined by the pellicle and the photomask and the thus generated ozone gas promotes the degradation of the agglutinant agent contained in the agglutinant layer, whereby a decomposition gas is emitted.

These problems arise not only in the case where an argon fluoride (ArF) excimer laser beam (193 nm wavelength) is used as exposure light but also in the case where a krypton fluoride (KrF) excimer laser beam (248 nm wavelength) is used as exposure light.

In addition, as explained above, in the case where the pellicle is used for a long time, since failure occurs owing to, for example, separation of solid-like foreign materials onto the pattern region of the photomask, it is necessary after a passage of a predetermined time period to remove the solid-like foreign materials separated out on the photomask by cleaning the photomask and replacing the pellicle with a new one, and in the case where the argon fluoride (ArF) excimer laser beam (193 nm wavelength) is used as the exposure light, it is necessary to replace the pellicle with a new one after a shorter time than in the case where the krypton fluoride (KrF) excimer laser beam (248 nm wavelength) is used as the exposure light. However, when the argon fluoride (ArF) excimer laser beam (193 nm wavelength) is projected onto the agglutinant agent contained in the agglutinant layer or the agglutinant agent contained in the agglutinant layer is exposed to an ozone gas, the degradation of the agglutinant agent is promoted and it becomes difficult to peel the photomask off the pellicle frame.

BRIEF SUMMARY

It is therefore an object of the present invention to provide a pellicle for lithography which generates only a small amount of decomposition gas even when the pellicle is used for a long time, thereby preventing solid-like foreign materials from separating out on a pattern region of a photomask and can suppress degradation of an agglutinant agent contained in the agglutinant layer used for fixing a photomask to a pellicle frame.

It is another object of the present invention is to provide a pellicle for lithography which can be easily peeled off from a photomask to allow shorter pellicle replacement time.

The inventors of the present invention vigorously pursued a study for accomplishing the above object and, as a result, made the discovery that in the case where an agglutinant layer is formed by hardening a curable composition containing a straight chain perfluoro compound having a perfluoro structure in a main chain, then even if an organic gas is emitted from the agglutinant layer, the emitted organic gas resists absorption of the argon fluoride (ArF) excimer laser beam (193 nm wavelength), even if the argon fluoride (ArF) excimer laser beam is projected onto the agglutinant layer, the agglutinant agent contained in the agglutinant layer resists decomposition, and even if ozone gas is generated in a closed space defined by the pellicle and the photomask, the degradation of the agglutinant agent contained in the agglutinant layer can be suppressed and the pellicle can be easily replaced with a new one.

Thus, the above and other objects of the present invention can be accomplished by a pellicle for lithography comprising a pellicle frame, a pellicle membrane adhered onto one surface of the pellicle frame and an agglutinant layer formed on the other surface of the pellicle frame, wherein the agglutinant layer is formed by hardening a curable composition containing a straight chain perfluoro compound having a perfluoro structure in a main chain.

In the present invention, the curable composition containing a straight chain perfluoro compound having a perfluoro structure in a main chain contains: (A) a straight chain perfluoro compound containing at least two alkenyl groups per molecule thereof, having a perfluoro structure in a main chain and serving as a base component, (B) a straight chain perfluoro compound containing one alkenyl group per molecule thereof, having a perfluoro structure in a main chain and serving as a reaction diluent, (C) an organosilicon compound containing at least two hydrosilyl groups per molecule thereof and serving as a cross-linking agent and a chain-lengthening agent, and (D) a platinum group metallic catalyst. For example, as a curable composition containing a straight chain perfluoro compound having a perfluoro structure in a main chain according to the present invention, a curable composition disclosed in Japanese Patent Application Laid Open No. 11-116685 can be used.

More specifically, since the agglutinant layer is formed by hardening a curable composition containing a straight chain perfluoro compound having a perfluoro structure in a main chain in the present invention, any gas emitted from the agglutinant layer is a fluorocarbon based organic gas whose absorbing capacity with respect to light having a short wavelength is low and therefore, even if an organic gas is emitted into the closed space defined by the pellicle and the photomask, the organic gas resists absorption of the argon fluoride (ArF) excimer laser beam (193 nm wavelength). Therefore, it is possible to efficiently prevent solid-like foreign materials from separating out on the pattern region of the photomask surrounded by the pellicle.

Further, in the present invention, since the agglutinant layer is formed by hardening a curable composition containing a straight chain perfluoro compound having a perfluoro structure in a main chain, the agglutinant layer has a high light resistance and resists decomposition even when the argon fluoride (ArF) excimer laser beam (193 nm wavelength) is projected thereonto, thereby preventing release of the decomposition gas, and even in the case where decomposition gas is emitted from the agglutinant layer owing to the irradiation with the argon fluoride (ArF) excimer laser beam (193 nm wavelength), since the emitted gas is a fluorocarbon based organic gas whose absorbing capacity with respect to light having a short wavelength is low, the fluorocarbon based organic gas resists absorption of the argon fluoride (ArF) excimer laser beam (193 nm wavelength) and it is therefore possible to efficiently prevent solid-like foreign materials from separating out on the pattern region of the photomask surrounded by the pellicle.

Moreover, in the present invention, since the agglutinant layer is formed by hardening a curable composition containing a straight chain perfluoro compound having a perfluoro structure in a main chain, the agglutinant layer has a high ozone gas resistance and even when ozone gas is generated in a closed space defined by the pellicle and the photomask, it is possible to prevent the degradation of the agglutinant layer and it is therefore possible to prevent emission of decomposition gas from the agglutinant layer.

In addition, in the present invention, since the agglutinant layer is formed by hardening a curable composition containing a straight chain perfluoro compound having a perfluoro structure in a main chain, the agglutinant layer has a high light resistance and a high ozone gas resistance and the degradation of the agglutinant layer can be consequently suppressed. Therefore, it is possible to easily replace the pellicle with a new one.

In the present invention, it is preferable for the penetration of the agglutinant layer after hardening the curable composition to be 50 to 100 as determined in accordance with ASTM D1403, since this ensures that the agglutinant layer has a considerably high agglutinant strength and a considerably high tack strength, while also having an appropriate softness. This makes it possible to prevent deformation of the photomask when the pellicle is mounted thereon.

The above described technical advantages can be obtained not only in the case where the argon fluoride (ArF) excimer laser beam (193 nm wavelength) is used as light for exposure but also in the case where the krypton fluoride (KrF) excimer laser beam (248 nm wavelength) is used as the exposure light.

The above and other objects and features of the present invention will become apparent from the following description made with reference to the accompanying drawings.

BRIEF DESCRIPTION OF THE DRAWING

FIG. 1 is a schematic longitudinal cross-section view of a pellicle which is a preferred embodiment of the present invention.

DETAILED DESCRIPTION

FIG. 1 is a schematic longitudinal cross-section view of a pellicle which is a preferred embodiment of the present invention.

As shown in FIG. 1, a pellicle 10 according to this embodiment includes a pellicle membrane 1 adhered to the upper end surface of a pellicle frame 3 via an adhesive layer 2.

On the other hand, as also shown in FIG. 1, an agglutinant layer 4 is formed on the lower end surface of the pellicle frame 3 by hardening a curable composition containing a straight chain perfluoro compound having a perfluoro structure in a main chain and a liner (not shown) is formed on the lower surface of the agglutinant layer 4 so as to be peelable.

In this embodiment, one of the side walls of the pellicle frame 3 is formed with an air pressure adjusting hole 6, namely, a vent hole 6 and a dust removal filter 7 for removing particles.

As shown in FIG. 1, a photomask 5 is fixed to the lower surface of the agglutinant layer 4.

The material for forming the pellicle membrane 1 is not particularly limited and, for example, an amorphous polyfluoride polymer conventionally used as a material for forming a pellicle membrane 1 for an excimer laser can be used for forming the pellicle membrane 1. Illustrative examples of amorphous polyfluoride polymer include "CYTOP" (Product Name) manufactured by ASAHI GLASS Co., Ltd., "Teflon" (Registered Trademark) and "AF" (Product Name) manufactured by Du Pont Kabushiki Kaisha. These polymers may be dissolved in a solvent as occasion demands when the pellicle membrane 1 is to be produced and may be arbitrarily dissolved in a fluorine based solvent.

The pellicle frame 3 can be formed of an aluminum alloy conventionally used for forming the pellicle frame 3 and illustrative examples of materials usable forming the pellicle frame 3 include a material defined in JIS A7075, a material defined in JIS A6061 and a material defined in JIS A5052. In the case where an aluminum alloy is used for forming the pellicle frame 3, the kind of the aluminum alloy is not particularly limited insofar as it can ensure the mechanical strength required for the pellicle frame 3.

It is preferable to roughen the surface of the pellicle frame 3 by means of sandblasting or chemical grinding prior to forming a polymer coating layer. As a method for roughening the surface of the pellicle frame 3, a conventional method can be used but in the case where an aluminum alloy is used for forming the pellicle frame 3, it is preferable to effect a blast processing on the surface of the pellicle frame 3 using stainless steel, carborundum, glass beads or the like and then effect chemical grinding on the surface of the pellicle frame 3 using sodium hydroxide, thereby roughening the surface of the pellicle frame 3.

The agglutinant layer 4 is formed by hardening a curable composition containing a straight chain perfluoro compound having a perfluoro structure in a main chain.

The curable composition containing a straight chain perfluoro compound having a perfluoro structure in a main chain has a high light resistance with respect to light having a short wavelength and resists decomposition even when the argon fluoride (ArF) excimer laser beam (193 nm wavelength) is projected thereonto, so that only a small amount of a decomposition product is generated. Therefore, it is possible to efficiently prevent solid-like foreign materials from separating out on a pattern region of the photomask 5 surrounded by the pellicle 10.

Further, since any organic gas released from the curable composition containing a straight chain perfluoro compound having a perfluoro structure in a main chain is a fluorocarbon based gas whose light absorbing capacity with respect to light having a short wavelength is low, even if an organic gas is emitted from the agglutinant layer 4 into a closed space defined by the pellicle 10 and the photomask 5, the gas resists absorption of the argon fluoride (ArF) excimer laser beam (193 nm wavelength). Therefore, it is possible to efficiently prevent solid-like foreign materials from separating out on the pattern region of the photomask 5 surrounded by the pellicle 10.

Moreover, since the curable composition containing a straight chain perfluoro compound having a perfluoro structure in a main chain has a high ozone gas resistance, even when ozone gas is generated in the closed space defined by the pellicle 10 and the photomask 5, the degradation of the agglutinant layer 4 can be prevented and it is therefore possible to prevent release of decomposition gas from the agglutinant layer 4.

In addition, since the agglutinant layer 4 formed by hardening the curable composition containing a straight chain perfluoro compound having a perfluoro structure in a main chain has a high light resistance and a high ozone gas resistance, it is possible to prevent degradation of the agglutinant layer 4 and it is therefore possible to easily replace the pellicle 10 with a new one.

Here, the agglutinant agent contained in the agglutinant layer 4 is required to have a considerably high agglutinant strength and a considerably high tack strength. The agglutinant agent contained in the agglutinant layer 4 is further required to have a considerably high cohesive strength and an appropriate softness. In the case where the curable composition containing a straight chain perfluoro compound having a perfluoro structure in a main chain is used as the agglutinant agent for forming the agglutinant layer 4, if the penetration of the agglutinant layer after hardening the curable composition is 50 to 100, since the agglutinant layer 4 has a considerably high agglutinant strength and a considerably high tack strength, while also having an appropriate softness, it is possible to prevent deformation of the photomask 5 when the pellicle 10 is mounted on the photomask 5.

WORKING EXAMPLES AND A COMPARATIVE EXAMPLE

Hereinafter, working examples and a comparative example will be set out in order to further clarify the technical advantages of the present invention.

Working Example 1

A pellicle frame made of an aluminum alloy having an outer size of 149 mm×113 mm×4.5 mm and a wall thickness of 2 mm was washed with deionized water and one surface of the pellicle frame was coated with a curable composition containing a straight chain perfluoro compound (Product Name "X-71-8023") manufactured by Shin-Etsu Chemical Co., Ltd. to form an agglutinant layer. Immediately after forming the agglutinant layer, the pellicle frame was heated by electromagnetic induction to harden the curable composition contained in the agglutinant layer. The penetration of the hardened agglutinant layer as defined in ASTM D1403 was 100 and the thickness of the agglutinant layer was 0.3 mm.

On the other hand, the other surface of the pellicle frame opposite to the surface on which the agglutinant layer was formed was coated with a CYTOP adhesive agent (Product Name "CTX-A") manufactured by ASAHI GLASS Co., Ltd. to form an adhesive layer. Then, the pellicle frame was heated at a temperature of 130° C. to harden the adhesive layer.

Thereafter, the adhesive layer formed on the other surface of the pellicle frame was adhered to a pellicle membrane affixed onto an aluminum frame whose size was larger than the pellicle frame and an unnecessary portion of the pellicle membrane positioned outside of the pellicle frame was removed, thereby completing a pellicle.

The thus fabricated pellicle was accommodated in a chamber made of quartz and the curable composition containing a straight chain perfluoro compound constituting the agglutinant layer was irradiated with the argon fluoride (ArF) excimer laser beam (193 nm wavelength). Then, gas generated in the chamber was analyzed using gas chromatography and it was found that the gas generated in the chamber was a fluorocarbon based gas and had an absorption coefficient with respect to 193 nm wavelength light of 0.1, which was sufficiently low.

The pellicle was mounted on a photomask and the deformation of the photomask was observed. The result was that the flatness of the photomask was 0.21 μm after the pellicle was mounted thereon while it was 0.20 μm before the pellicle was mounted thereon and it was thus found that the flatness of the photomask was varied only by 0.01 μm by mounting the pellicle on the photomask.

Working Example 2

A pellicle frame made of an aluminum alloy, having an outer size of 149 mm×113 mm×4.5 mm and a wall thickness of 2 mm was washed with a deionized water and one surface of the pellicle frame was coated with a curable composition containing a straight chain perfluoro compound (Product Name "SIFEL8070") manufactured by Shin-Etsu Chemical Co., Ltd. to form an agglutinant layer. A PET film was then brought into contact with the surface of the agglutinant layer. Thereafter, the pellicle frame was heated by electromagnetic induction to harden the curable composition contained in the agglutinant layer and the PET film was then peeled off the surface of the agglutinant layer. The penetration of the hardened agglutinant layer as defined in ASTM D1403 was 70 and the thickness of the agglutinant layer was 0.3 mm.

On the other hand, the other surface of the pellicle frame opposite to the surface on which the agglutinant layer was formed was coated with a CYTOP adhesive agent (Product Name "CTX-A") manufactured by ASAHI GLASS Co., Ltd. to form an adhesive layer. Then, the pellicle frame was heated at a temperature of 130° C. to harden the adhesive layer.

Thereafter, the adhesive layer formed on the other surface of the pellicle frame was adhered to a pellicle membrane affixed onto an aluminum frame whose size was larger than the pellicle frame and an unnecessary portion of the pellicle membrane positioned outside of the pellicle frame was removed, thereby completing a pellicle.

The thus fabricated pellicle was accommodated in a chamber made of quartz and the curable composition containing a straight chain perfluoro compound constituting the agglutinant layer was irradiated with the argon fluoride (ArF) excimer laser beam (193 nm wavelength). Then, gas generated in the chamber was analyzed using gas chromatography and it was found that the gas generated in the chamber was a fluorocarbon based gas and had an absorption coefficient with respect to 193 nm wavelength light of 0.1, which was sufficiently low.

The pellicle was mounted on a photomask and the deformation of the photomask was observed. The result was that the flatness of the photomask was 0.21 μm after the pellicle was mounted thereon while it was 0.20 μm before the pellicle was mounted thereon and it was thus found the flatness of the photomask was varied only by 0.01 μm by mounting the pellicle on the photomask.

Working Example 3

A pellicle frame made of an aluminum alloy, having an outer size of 149 mm×113 mm×4.5 mm and a wall thickness of 2 mm was washed with a deionized water and one surface of the pellicle frame was coated with a curable composition containing a straight chain perfluoro compound (Product Name "X-71-8122") manufactured by Shin-Etsu Chemical Co., Ltd. to form an agglutinant layer. A PET film was then brought into contact with the surface of the agglutinant layer. Thereafter, the pellicle frame was heated by electromagnetic induction to harden the curable composition contained in the agglutinant layer and the PET film was then peeled off from the surface of the agglutinant layer. The penetration of the hardened agglutinant layer as defined in ASTM D1403 was 70 and the thickness of the agglutinant layer was 0.3 mm.

On the other hand, the other surface of the pellicle frame opposite to the surface on which the agglutinant layer was formed was coated with a CYTOP adhesive agent (Product Name "CTX-A") manufactured by ASAHI GLASS Co., Ltd. to form an adhesive layer. Then, the pellicle frame was heated at a temperature of 130° C. to harden the adhesive layer.

Thereafter, the adhesive layer formed on the other surface of the pellicle frame was adhered to a pellicle membrane affixed onto an aluminum frame whose size was larger than the pellicle frame and an unnecessary portion of the pellicle membrane positioned outside of the pellicle frame was removed, thereby completing a pellicle.

The thus fabricated pellicle was accommodated in a chamber made of quartz and the curable composition containing a straight chain perfluoro compound constituting the agglutinant layer was irradiated with the argon fluoride (ArF) excimer laser beam (193 nm wavelength). Then, gas generated in the chamber was analyzed using gas chromatography and it was found that the gas generated in the chamber was a fluorocarbon based gas and had an absorption coefficient with respect to 193 nm wavelength light of 0.1, which was sufficiently low.

The pellicle was mounted on a photomask and the deformation of the photomask was observed. The result was that the flatness of the photomask was 0.21 μm after the pellicle was mounted thereon while it was 0.20 μm before the pellicle was mounted thereon and it was found that the flatness of the photomask was varied only by 0.01 μm by mounting the pellicle on the photomask.

Comparative Example

A pellicle frame made of an aluminum alloy, having an outer size of 149 mm×113 mm×4.5 mm and a wall thickness of 2 mm was washed with a deionized water and one surface of the pellicle frame was coated with an acrylic based agglutinant agent (Product Name "SK-Dyne1425") manufactured by Soken Chemical & Engineering Co., Ltd. to form an agglutinant layer. Immediately after forming the agglutinant layer, the pellicle frame was heated by electromagnetic induction to harden the acrylic based agglutinant agent. The penetration of the hardened agglutinant layer as defined in ASTM D1403 was 15 and the thickness of the agglutinant layer was 0.3 mm.

On the other hand, the other surface of the pellicle frame opposite to the surface on which the agglutinant layer was formed was coated with a CYTOP adhesive agent (Product Name "CTX-A") manufactured by ASAHI GLASS Co., Ltd. to form an adhesive layer. Then, the pellicle frame was heated at a temperature of 130° C. to harden the adhesive layer.

Thereafter, the adhesive layer formed on the other surface of the pellicle frame was adhered to a pellicle membrane affixed onto an aluminum frame whose size was larger than the pellicle frame and an unnecessary portion of the pellicle membrane positioned outside of the pellicle frame was removed, thereby completing a pellicle.

The thus fabricated pellicle was accommodated in a chamber made of quartz and the agglutinant layer was irradiated with the argon fluoride (ArF) excimer laser beam (193 nm wavelength). Then, gas generated in the chamber was analyzed using gas chromatography and it was found that a butanol gas, a butanal gas and a butyl formate gas were generated in the chamber and the absorption coefficients of the respective generated gases with respect to light having a wavelength of 193 nm were 1.0, 3.4 and 2.4, respectively, all of which were high.

The pellicle was mounted on a photomask and the deformation of the photomask was observed. The result was that the flatness of the photomask was 0.20 μm before the pellicle was mounted thereon while it was 0.30 μm after the pellicle was mounted thereon and it was found that the flatness of the photomask was varied by 0.10 μm by mounting the pellicle on the photomask.

As apparent from Working Examples 1 to 3 and Comparative Example, it was found that in Comparative Example, whose agglutinant layer was formed using the acrylic based agglutinant agent instead of the curable composition containing a straight chain perfluoro compound having a perfluoro structure in a main chain, when the agglutinant layer was irradiated with the argon fluoride (ArF) excimer laser beam (193 nm wavelength), butanol gas, butanal gas and butyl formate gas were generated and the absorption coefficients of the thus generated respective gases with respect to light having a wavelength of 193 nm were 1.0, 3.4 and 2.4, respectively and they were high. Thus, it was found that there was a considerable risk that these gasses reacted with the argon fluoride (ArF) excimer laser beam in the closed space defined by the pellicle and the photomask and solid-like foreign materials separated out on a pattern region of the photomask surrounded by the pellicle.

To the contrary, it was found that in Working Examples 1 to 3 in each of which the agglutinant layer was formed by hardening the curable composition containing a straight chain perfluoro compound having a perfluoro structure in a main chain, since any gas generated by projecting the argon fluoride (ArF) excimer laser beam (193 nm wavelength) onto the agglutinant layer was a fluorocarbon based gas and the absorption coefficient of the generated gas with respect to light having a wavelength of 193 nm was 0.1 and sufficiently low, there was almost no risk of fluorocarbon based gas reacting with the argon fluoride (ArF) excimer laser beam in the closed space defined by the pellicle and the photomask and solid-like foreign materials separated out on the pattern region of the photomask surrounded by the pellicle.

Further, in Comparative Example whose the agglutinant layer was formed using the acrylic based agglutinant agent instead of the curable composition containing a straight chain perfluoro compound having a perfluoro structure in a main chain, it was found that since the penetration of the hardened agglutinant layer as defined in ASTM D1403 was 15, not only the agglutinant strength and the tack strength were insufficient but also the agglutinant layer was too hard and as a result, the flatness of the photomask was varied by 0.10 μm between before and after the pellicle was mounted on the photomask and the photomask was greatly deformed by mounting the pellicle thereon.

To the contrary, in Working Examples 1 to 3, in each of which the agglutinant layer was formed by hardening the curable composition containing a straight chain perfluoro compound having a perfluoro structure in a main chain, it was found that since the penetrations of the respective hardened agglutinant layers as defined in ASTM D1403 were 100, 70 and 70, respectively, the agglutinant layer had a sufficiently high agglutinant strength and a sufficiently high tack strength, while also having a sufficiently high cohesive force and an appropriate softness. As a result, since the flatness of the photomask was varied only by 0.01 μm between before and after the pellicle was mounted on the photomask, strain and deformation of the photomask were negligible between before and after the pellicle was mounted on the photomask.

The present invention has thus been shown and described with reference to a specific embodiment and Working Examples. However, it should be noted that the present invention is in no way limited to the details of the described arrangements but changes and modifications may be made without departing from the scope of the appended claims.

For example, in Working Example 1 the agglutinant layer formed on one surface of the pellicle frame for adhering the pellicle to the photomask was formed by applying the curable composition containing a straight chain perfluoro compound (Product Name "X-71-8023") manufactured by Shin-Etsu Chemical Co., Ltd. onto the one surface of the pellicle frame and hardening it, in Working Example 2 the agglutinant layer formed on one surface of the pellicle frame for adhering the pellicle to the photomask was formed by applying the curable composition containing a straight chain perfluoro compound (Product Name "SIFEL8070") manufactured by Shin-Etsu Chemical Co., Ltd. onto the one surface of the pellicle frame and hardening it and in Working Example 3 the agglutinant layer formed on one surface of the pellicle frame for adhering the pellicle to the photomask was formed by applying the curable composition containing a straight chain perfluoro compound (Product Name "X-71-8122") manufactured by Shin-Etsu Chemical Co., Ltd. onto the one surface of the pellicle frame and hardening it. However, it is sufficient to form an agglutinant layer by hardening a curable composition containing a straight chain perfluoro compound having a perfluoro structure in a main chain and the curable composition is not particularly limited.

According to the present invention, it is possible to provide a pellicle for lithography which produces only a small amount of a decomposition gas even when the pellicle is used for a long time, thereby preventing solid-like foreign materials from separating out on a pattern region of a photomask and can suppress degradation of an the agglutinant agent contained in an agglutinant layer to be used for fixing a photomask to a pellicle frame.

Further, according to the present invention, it is possible to provide a pellicle for lithography which can be easily peeled off from a photomask and replaced with a new one.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A pellicle for lithography comprising a pellicle frame, a pellicle membrane adhered onto one surface of the pellicle frame and an agglutinant layer formed on the other surface of the pellicle frame, wherein the agglutinant layer is formed by hardening a curable composition containing a straight chain perfluoro compound having a perfluoro structure in a main chain.

2. A pellicle for lithography in accordance with claim 1, wherein the curable composition containing a straight chain perfluoro compound having a perfluoro structure in a main chain contains: (A) a straight chain perfluoro compound containing at least two alkenyl groups per molecule thereof, having a perfluoro structure in a main chain and serving as a base component, (B) a straight chain perfluoro compound containing one alkenyl group per molecule thereof, having a perfluoro structure in a main chain and serving as a reaction diluent, (C) an organosilicon compound containing at least two hydrosilyl groups per molecule thereof and serving as a cross-linking agent and a chain-lengthening agent, and (D) a platinum group metallic catalyst.

3. A pellicle for lithography in accordance with claim 1, wherein the penetration of the agglutinant layer after hardening the curable composition is 50 to 100 as determined in accordance with ASTM D1403.

4. A pellicle for lithography in accordance with claim 2, wherein the penetration of the agglutinant layer after hardening the curable composition is 50 to 100 as determined in accordance with ASTM D1403.

5. A pellicle in accordance with claim 1, wherein the agglutinant layer is formed by thermally hardening the curable composition.

* * * * *